(12) United States Patent
Kahen

(10) Patent No.: US 8,274,138 B2
(45) Date of Patent: Sep. 25, 2012

(54) II-VI SEMICONDUCTOR NANOWIRES

(75) Inventor: Keith B. Kahen, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 37 days.

(21) Appl. No.: 12/570,314

(22) Filed: Sep. 30, 2009

(65) Prior Publication Data

US 2011/0073839 A1    Mar. 31, 2011

(51) Int. Cl.
*H01L 29/22*    (2006.01)
(52) U.S. Cl. .......... 257/614; 257/78; 257/442; 438/478; 977/813; 977/824; 977/932
(58) Field of Classification Search .................. None
See application file for complete search history.

(56) References Cited

U.S. PATENT DOCUMENTS

| | | | |
|---|---|---|---|
| 2002/0175408 A1 | 11/2002 | Majumdar et al. | |
| 2003/0168964 A1* | 9/2003 | Chen | 313/495 |
| 2004/0079278 A1* | 4/2004 | Kamins et al. | 117/84 |
| 2005/0048697 A1* | 3/2005 | Uang et al. | 438/108 |
| 2005/0191774 A1* | 9/2005 | Li et al. | 438/22 |
| 2005/0266662 A1* | 12/2005 | Yi | 438/479 |
| 2006/0009003 A1* | 1/2006 | Romano et al. | 438/382 |
| 2007/0252132 A1 | 11/2007 | Kamins et al. | |
| 2008/0105982 A1* | 5/2008 | Horibe et al. | 257/764 |
| 2008/0191317 A1* | 8/2008 | Cohen et al. | 257/618 |
| 2008/0251780 A1* | 10/2008 | Li et al. | 257/13 |
| 2009/0127540 A1* | 5/2009 | Taylor | 257/14 |

FOREIGN PATENT DOCUMENTS

WO    WO 03/097904 A1    11/2003

OTHER PUBLICATIONS

Thapa et al, Synthesis of cubic aluminum nitride by VLS technique using gold chloride as a catalyst and its optical and field emission properties, Journal of Alloys and Compounds, (2008).
Lee et al, High-brightness gallium nitride nanowire UV blue light emitting diodes, Philosophical Magazine, vol. 87, Nos. 14-15, 2105-2115, May 2007.
Tang et al, Organic electroluminescent diodes, Appl. Phys. Lett 51 (12) Sep. 1987, 913-915.
Krames et al, Status and Future of High-Power Light-Emitting Diodes for Solid-State Lighting, Jour. of Display Technology, vol. 3, No. 3, Jun. 2007, pp. 160-175.
Haranath et al, Enhanced luminescence of $Y_3Al_5O_{12}:Ce^{3+}$ nanophosphor for white light-emitting diodes, Appl. Physics. Lett 89, 173118 (2006).
Zubia et al, Nanoheteroepitaxy: The Application of nanostructuring and substrate compliance to the heteroepitaxy of mismatched semiconductor materials, Journal of Appl. Physics, vol. 85, No. 9, May 1999, pp. 6492-6496.

(Continued)

*Primary Examiner* — Evan Pert
*Assistant Examiner* — Andres Munoz
(74) *Attorney, Agent, or Firm* — Raymond L. Owens

(57) ABSTRACT

A high quality II-VI semiconductor nanowire is disclosed. A plurality of II-VI semiconductor nanowires is provided, with each being fixed to a support. Each nanowire terminates in a free end and a metal alloy nanoparticle is fixed to each nanowire at its free end.

16 Claims, 9 Drawing Sheets

OTHER PUBLICATIONS

Hersee et al, The Controlled Growth of GaN Nanowires, Nano Letters, V. 6, No. 8, 2006, 1808-1811.

Barrelet et al, Synthesis of CdS and ZnS Nanowires Using Single-Source Molecular Precursors, J. Am. Chem. Soc. 2003 125, 11498-11499.

Salfi, et al Electrical properties of Ohmic contacts to ZnSe nanowires and their application to nanowire-based photodetection, Applied Phys. Left. 89, 261112 (2006).

Zhang et al, Luminance of ZnSe nanowires grown by metalorganic vapor phase deposition under different pressures, Journal of Appl. Physics, V. 95, No. 10, 2004, pp. 5752-5755.

Phillpose et al, Enhancement of band edge luminescence in ZnSe nanowires, Journal of Applied Physics, 100, 084316 (2006).

Ohno et al, Fe-catalytic growth of ZnSe nanowires on a ZnSe(001) surface at low temperatures by molecular-beam epitaxy, Applied Physics Left. 87, 043105 (2005).

Colli et al, Low-temperature synthesis of ZnSe nanowires, and nanosaws by catalyst-assisted molecular-beam display, Applied Physics Lett. 86, 153103 (2005).

Hersee et al, GaN nanowire light emitting diodes based on templated and scalable nanowire growth process, Electronic Letters, Jan. 2009, vol. 45, No. 1 pp. 75-76.

Ming Lin, et al.: "Influence of Au Catalyst on the Growth of ZnS Nanowires", Chemical Physics Letters, North-Holland, Amsterdam, NL, vol. 400, No. 1-3, Dec. 11, 2004, pp. 175-178, XP004660013, ISSN: 0009-2614, DOI: DOI: 10.1016/J.CPLETT.2004.10.115 3. Results and discussion.

Y.F. Chan, et al.: "ZnSe Nanowires Epitaxially Grown on GaP(111) Substrates by Molecular-Beam Epitaxy", Applied Physics Letter, AIP, American Institute of Physics, Melville, NY, US, vol. 83, No. 13, Sep. 29, 2003, pp. 2665-2667, XP012035251, ISSN: 0003-6951, DOI: DOI: 10.1063/1.1615293, p. 2665, left-hand column, last paragraph—p. 2666, left-hand column, paragraph 1.

Seu Yi Li, et al.: "Field Emission and Photofluorescent Characteristics of Zinc Oxide Nanowires Synthesized by a Metal Catalyzed Vapor-liquid-solid Process", Journal of Applied Physics, American Institute of Physics, New York, US, vol. 95, No. 7, Apr. 1, 2004, pp. 3711-3716, XP012067697, ISSN: 0021-8979, DOI: DOI: 10.1063/1.1655685 III., Results and Discussion.

E. Janik, et al.: "ZnTe Nanowires Grown on GaAs(100) Substrates by Molecular Beam Epitaxy", Applied Physics Letters, AIP, American Institute of Physics, Melville, NY. US, vol. 89, No. 13, Sep. 27, 2006, pp. 133114-133114, XP012086052, ISSN: 0003-6951, DOI: DOI: 10.1063/1.2357334, pp. 133114-1, right-hand column, line 17—pp. 133114-2, left-hand column, line 28.

\* cited by examiner

II-VI SEMICONDUCTOR NANOWIRES

CROSS REFERENCE TO RELATED APPLICATION

Reference is made to commonly assigned U.S. patent application Ser. No. 12/570,382 filed Sep. 30, 2009 entitled "Forming Catalyzed II-VI Semiconductor Nanowires" by Keith B. Kahen, the disclosure of which is incorporated herein.

FIELD OF THE INVENTION

The present invention relates to high quality II-VI semiconductor nanowires.

BACKGROUND OF THE INVENTION

Worldwide interest in light-emitting diode (LED) technology has rapidly increased over the past two decades. Starting with inorganic LEDs developed in the 60s, they have found their way into numerous lighting, signaling, and display applications, such as, automotive lighting, architectural lighting, flashlights, and backlights for LCD-based displays. Since the turn of the century they have started to appear in more mainstream lighting applications, which as a result of their long life and very high efficacy, will result in significant savings in energy usage. This set of applications include traffic signaling lights, street lights, and most recently, residential lighting.

Organic-based LEDs (OLED) were developed in the late 70s (Tang et al, Appl. Phys. Lett. 51, 913 (1987)) and have just recently begun to appear in commercial display applications, such as, televisions, picture frames, and digital camera displays. In the last 5 years or so, good progress has also been made to make OLEDs a viable option for general lighting applications. Despite large gains in their efficiency, OLED lighting will likely remain a niche application due to their environmental sensitivity, shorter lifetime, and low output power density. The latter issue is the dominant one since it requires OLED lighting products to have large surface areas in order to produce acceptable amounts of lumens.

In spite of the deepening penetration of inorganic LEDs into mainstream lighting, unresolved issues still remain, such as, high cost, poor color, and sub-desirable efficiency. Overall there are two ways for creating white LEDs (M. Krames et al., J. Display Technol. 3, 160 (2007)), combining blue, green, and red LEDs to form white LED arrays or combining a blue LED with appropriate down conversion phosphors to create a white light source. The first way yields a higher overall efficiency. Despite very high internal quantum efficiencies for red and blue LEDs of approximately 90 and 70%, respectively, the IQE of green LEDs at the desirable wavelengths of 540-560 nm is below 10%. This "green gap" issue has been recognized for many years (large strain develops in the active region as a result of incorporating sufficient In in the GaN in order to form green emitting InGaN) and despite numerous efforts, still remains largely unresolved. Combining blue GaN LEDs with appropriate phosphors has recently yielded white LEDs with efficacies over 120 Lumens/Watt. Unfortunately, the correlated color temperature (CCT) of the corresponding white is typically high (>6000 K), yielding a cold light which lacks sufficient red response. Another outstanding issue is the efficiency of the phosphors, which for commercial phosphors are currently at 65% (include the efficiency hit due to the Stoke shift) (D. Haranath et al., Appl. Phys. Lett. 89, 173118 (2006)). Both inorganic LED approaches for white light, as of today, are approximately a factor of 100 too costly to engender significant market penetration into the residential market without significant government subsidies or incentives.

As discussed above, despite the impressive efficiency and large penetration to date of inorganic LEDs (to be called LEDs) into lighting applications, outstanding issues still remain. Focusing on color-mixed LEDs (combining red, green, and blue LEDs), the two pressing issues are high cost and the sub-par performance of green LEDs. A large part of the high cost is associated with conventional LEDs being grown on crystalline substrates. More specifically, sapphire or SiC for blue and green LEDs and GaAs for red LEDs. As discussed above, the sticking point associated with creating efficient InGaN-based LEDs is that incorporating In into the active region results in significant strain relative to the cladding layers (R. Dupuis et al., J. Display Technol. 3, 126 (2007)).

Recently, there has been significant research activity towards creating nanowire-based LEDs, where the nanowires are grown using MOVPE techniques by either a templated (S. Hersee et al., Electron. Lett. 45, 75 (2009)) or vapor liquid solid (VLS) approach (S. Lee et al. Philosophical Magazine 87, 2105 (2007)). The advantages of employing nanowires as LED elements are that they can be grown on inexpensive substrates (such as glass) and the amount of lattice mismatch that can be tolerated between LED layers is significantly higher when the crystalline material is a 20-100 nm thick nanowire as compared to bulk heterostructure growth (D. Zubia et al., J. Appl. Phys. 85, 6492 (1999)). Green LEDs can be formed by two ways, incorporating InGaN emissive layers in GaN-based pin nanowires, or by forming II-VI material based pin nanowires. Progress has been made on both fronts, but many issues still remain unresolved. For GaN-based nanowires, efficient doping is still problematic and the quantum efficiency of the emitters remains sub-par (S. Hersee et al., Nano Lett. 6, 1808 (2006)). For II-VI material based pin nanowires, green LEDs can be formed by employing CdZnSe or ZnSeTe in the active region; however, the number of unresolved issues is even larger.

Progress in creating highly emissive (C. Barrelet et al., JACS 125, 11498 (2003)) and dopable II-VI nanowires has been limited. Almost no mention has been made of successful doping of II-VI nanowires, or where doping has been mentioned it is stated that the undoped ZnSe nanowires have low resistivity, ~1 ohm-cm (J. Salfi et al. Appl. Phys. Lett. 89, 261112 (2006)), which implies a high degree of defects since undoped ZnSe should be highly resistive ($>10^5$ ohm-cm). With regard to emissive characteristics, the photoluminescence (PL) of high quality epi-material should show band gap exciton features and a very small amount of mid-gap defect emission. All reported ZnSe nanowires show large levels of defect emission in their PL response (X. Zhang et al., J. Appl. Phys. 95, 5752 (2004)). The one article (U. Philipose et al., J. Appl. Phys. 100, 084316 (2006)) in which the defect emission was reduced was where added Zn was post-growth diffused into the ZnSe nanowires in order to reduce the large amount of Zn vacancies present after nanowire growth. Performing an extra diffusion step is costly and unworkable when the emitter layer is part of a pin diode device structure. Consequently, in spite of the technological importance of device quality II-VI nanowires, problems remain.

SUMMARY OF THE INVENTION

In accordance with the present invention there is provided:
a plurality of semiconductor nanowires each being fixed to a support includes II-VI materials and each nanowire terminating in a free end and a metal alloy nanoparticle is fixed to each nanowire at its free end.

The present invention provides an improved II-VI semiconductor nanowire. In comparison with conventional II-VI semiconductor nanowires terminating in gold nanoparticles, the undoped nanowires are intrinsic, doped nanowires can be formed using conventional substitutional elements, and the emission spectra are free of unwanted defect emissions.

In accordance with the present invention, II-VI semiconductor nanowires terminate in a free end with metal alloy nanoparticles fixed to each nanowire. This structure provides an advantage of reduced native defects since the nanowires can be grown at the desirable growth temperatures of 300-340° C. As a result, the II-VI semiconductor nanowires can be doped p- or n-type by using conventional substitutional dopants and the emission characteristics of undoped nanowires is free of unwanted defect emission. Contrarily, conventional II-VI semiconductor nanowires with a free end of gold contain numerous native defects that make modifying the doping characteristics difficult and the undoped nanowire emission contains large amounts of unwanted defect emission. Overall high quality II-VI semiconductor nanowires are desirable elements in numerous electronic and optoelectronic applications, such as, LEDs, lasers, phosphors, rectifiers, solar cells, and transistors.

DETAILED DESCRIPTION OF THE INVENTION

It is desirable to form semiconductor optoelectronic and electronic devices that not only have good performance, but also are low cost and can be deposited on arbitrary substrates. Using II-VI semiconductor nanowires as the building blocks for semiconductor devices would result in optoelectronic and electronic devices that confer these advantages. As is well known in the art, semiconductor nanowires can be grown by both colloidal and vapor-based VLS processes. The colloidal processes have some advantages with respect to cost, however, at this time, it is difficult to custom tailor their composition. Vapor-based VLS techniques have been performed using either molecular beam epitaxy (MBE) or metal-organic vapor phase epitaxy (MOVPE). The MBE technique can result in very high quality semiconductors being formed, however, it is a very expensive growth technique and as a result is limited to research scale investigations. MOVPE is currently being used worldwide to form commercial high quality III-V LEDs and lasers. As a result, the focus below will be on II-VI semiconductor nanowires grown by VLS techniques using MOVPE equipment.

Figure 1:
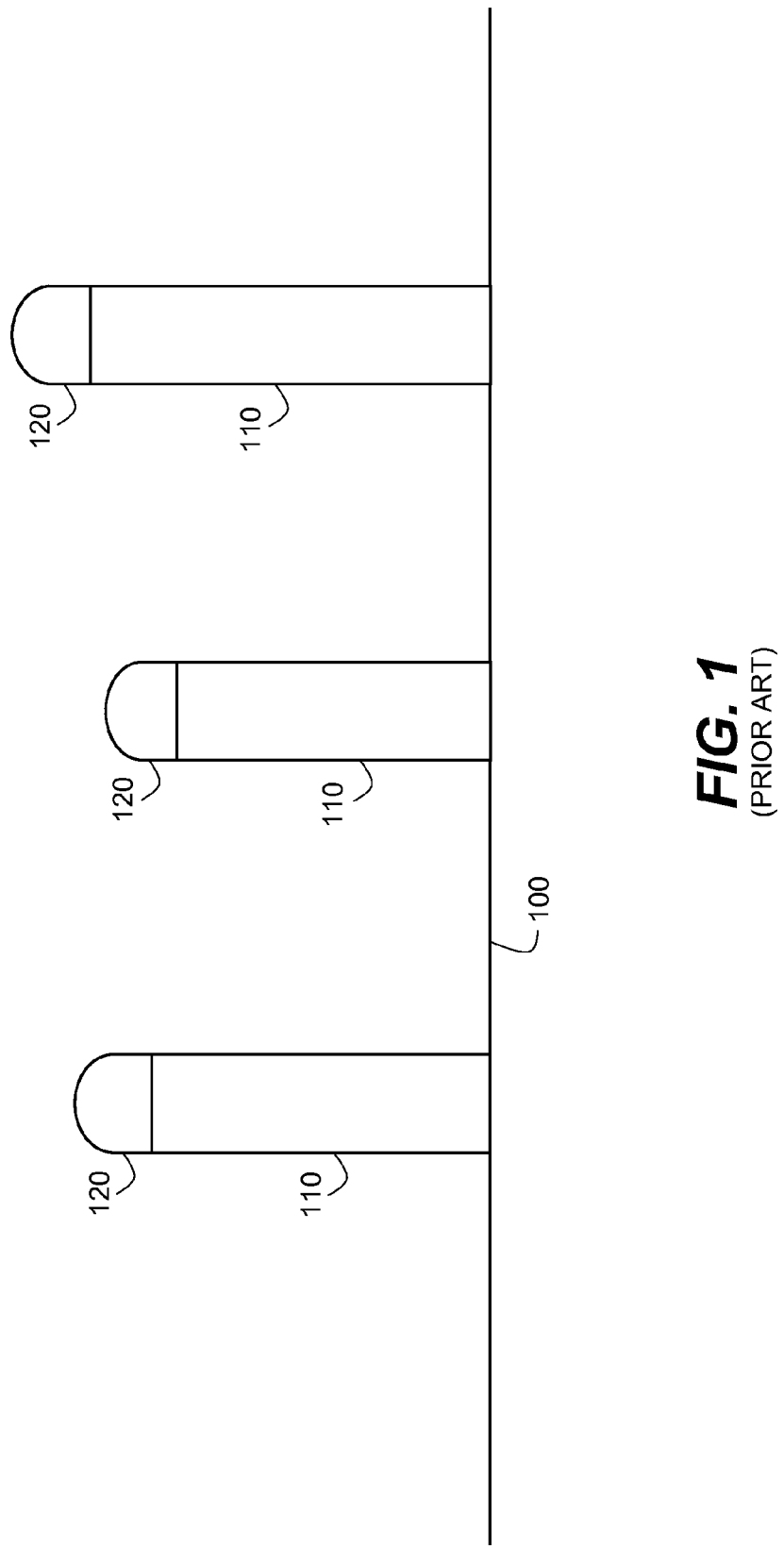
FIG. 1 shows a schematic of a prior art II-VI semiconductor nanowire.

A prior art II-VI semiconductor nanowire is shown in FIG. 1. In the figure, the substrate is 100, the semiconductor nanowire is 110, and the metal nanoparticle is 120. As is well known in the art, the typical metal nanoparticle 120 is composed of gold. However, others have also used metals, such as, Ag, Ni, and Ti. In addition, gold compounds have also been used as catalyst, such as, $AuCl_3$ (R. Thapa et al., J. Alloys and Compounds 475, 373 (2009)). To begin a growth sequence, the metal nanoparticles need to be distributed on the substrate surface. Well known techniques for forming a distribution of metal nanoparticles on the substrate are drop or spin casting a dispersion of metallic nanoparticles, and depositing a thin metal (by sputtering or thermal evaporation) on the substrate surface. With regard to the latter procedure, very thin metal layers (<5 nm) typically deposit in discrete nano-islands instead of continuous films. Sometimes the substrates containing the thin metal deposits are heated in order to aid in the formation of metal nanoparticles 120 having particular sizes. Following the formation of the metal nanoparticles 120, MOVPE deposition of the semiconductor nanowires 110 occurs at the growth temperature. The growth temperature is typically chosen such that the metal nanoparticles 120 or catalysts are molten at that temperature. Semiconductor nanowires can be formed using MOVPE via a VSS (vapor solid solid) process; however, it has been found that the quality of nanowires is inferior to that formed when the catalyst are liquid during the growth step. Using gold as the catalyst and taking into account the reduction in the gold melting point due to the gold being in nanoparticle form, typical II-VI semiconductor nanowire MOVPE growth temperatures are ~550° C. This temperature is significantly above the preferred growth temperature (270-330° C.) of crystalline II-VI semiconductors, such as, ZnSe. As a result, the ensuing II-VI semiconductor nanowires contain large numbers of undesirable native defects, which impacts both the quality of the emission (for undoped nanowires) and the ability to modulate the doping of the nanowires. Using MBE the growth temperature of ZnSe nanowires by VLS has been lowered to the low 300° C. range; however, the morphology of the resultant nanowires has been average at best (Y. Ohno et al., Appl. Phys. Lett. 87, 043105 (2005); A. Colli et al., Appl. Phys. Lett. 86, 153103 (2005)).

The key to growing II-VI semiconductor nanowires with reduced native defects is to engineer the metal catalysts such that the nanowires can be grown at the preferred growth temperatures (270-330° C.). The engineered metal catalysts must be such that they act as preferred growth sites for the II-VI semiconductor materials, and, secondly, the metal atoms don't diffuse into the II-VI semiconductor nanowires during the growth sequence and form unwanted impurities (which impact the emission or ability to dope the nanowires). Finally, the metal catalyst should be non-toxic. Given all of these constraints, choices are metal alloys of Au (since Au acts as an excellent catalyst site), such as, Au—In, Au—Ga, Au—Sn, and Au—Pb. Thin Au—In films were formed by sequential thermal evaporation of gold, followed by indium. Upon growing ZnSe films via MOVPE at a Zn:Se ratio of ~1:3.6 (found to be ideal for forming high quality epitaxial crystalline films) and a temperature of 330° C., it was found that nanowire arrays can be formed. Photoluminescence of the nanowires (at 77° K) revealed two sets of peaks, one associated with bandgap region emission and the other associated with n-type substitutional dopants. As a result of those results, Au—Ga catalysts were determined to be an equally unattractive choice. Next the column IV elements of Sn and Pb were considered. Both have low melting points and form alloys with Au in all proportions. In addition, both are not known to be dopants in II-VI materials. Lead alloys were not tried due to its known toxicity. In the example section below, results are given to show that high quality II-VI semiconductor nanowires can be formed using Au—Sn catalyst in MOVPE-based VLS growth. Photoluminescence at 77° K reveals bandgap excitonic features and the absence of sub-bandgap defect emission (indicating that native defects are not formed and that the Sn did not dope the nanowires).

Figure 2:
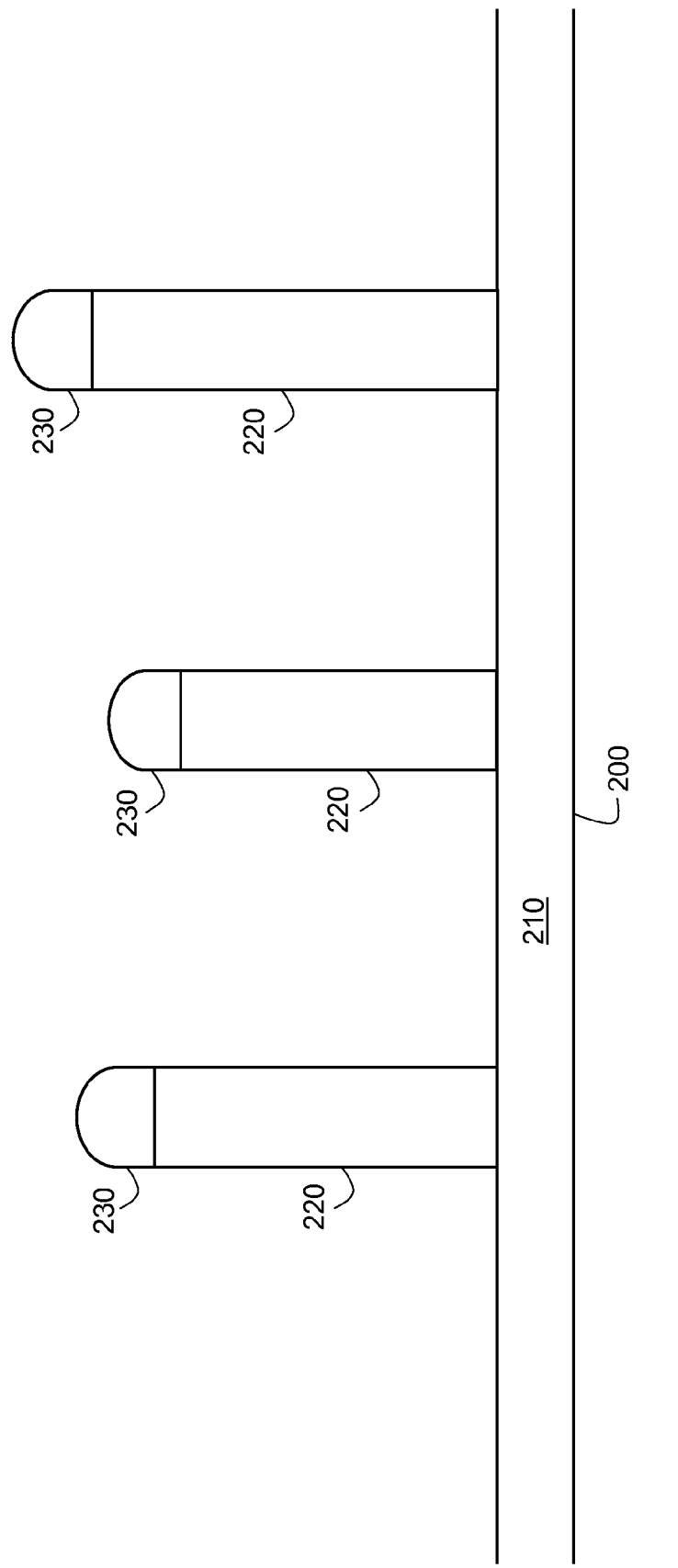
FIG. 2 shows a schematic of a II-VI semiconductor nanowire wherein attached at the free end is a metal alloy nanoparticle.

FIG. 2 illustrates the semiconductor nanowires of the present invention. The II-VI semiconductor nanowires 220 can either be grown directly on a support 200 or on the surface of a low energy surface film 210. The support 200 can be any material structure which can withstand the MOVPE growth temperatures (up to ~400° C. for the shelling materials). Correspondingly, glass, semiconductor substrates, such as Si or GaAs, metal foils, and high temperature plastics can be used as supports. The optional low energy surface film 210 is deposited on the support 200 in order to enhance the selectivity of the nanowire growth. As is well known in the art, typical low energy surface films 210 are oxides, such as, silicon oxide and aluminum oxide. They can be deposited by processes well known in the art, such as, sputtering, atomic layer deposition (ALD), and chemical vapor deposition. In cases where the support 200 is silicon and the low energy surface film 210 is silicon oxide, the silicon oxide can also be formed by wet or dry thermal oxide processes. The figure shows that each II-VI semiconductor nanowire 220 is attached to the support 200 (or the optional low energy surface film 210) at one end. The free end of each II-VI semiconductor nanowire 220 is terminated in a metal alloy nanoparticle 230. As discussed above the metal alloy nanoparticle 230 should: 1) have a reduced melting point of ~330° C. and less; 2) enable localized growth of the nanowires; 3) not dope the nanowires; and 4) be non-toxic. Au—Sn metallic alloys were found to meet all of these criteria. Even though Au—Sn alloys are reported in this disclosure, other metallic alloy nanoparticle 230 candidates are equally valid as long as they meet the four criteria discussed above.

Figure 3:
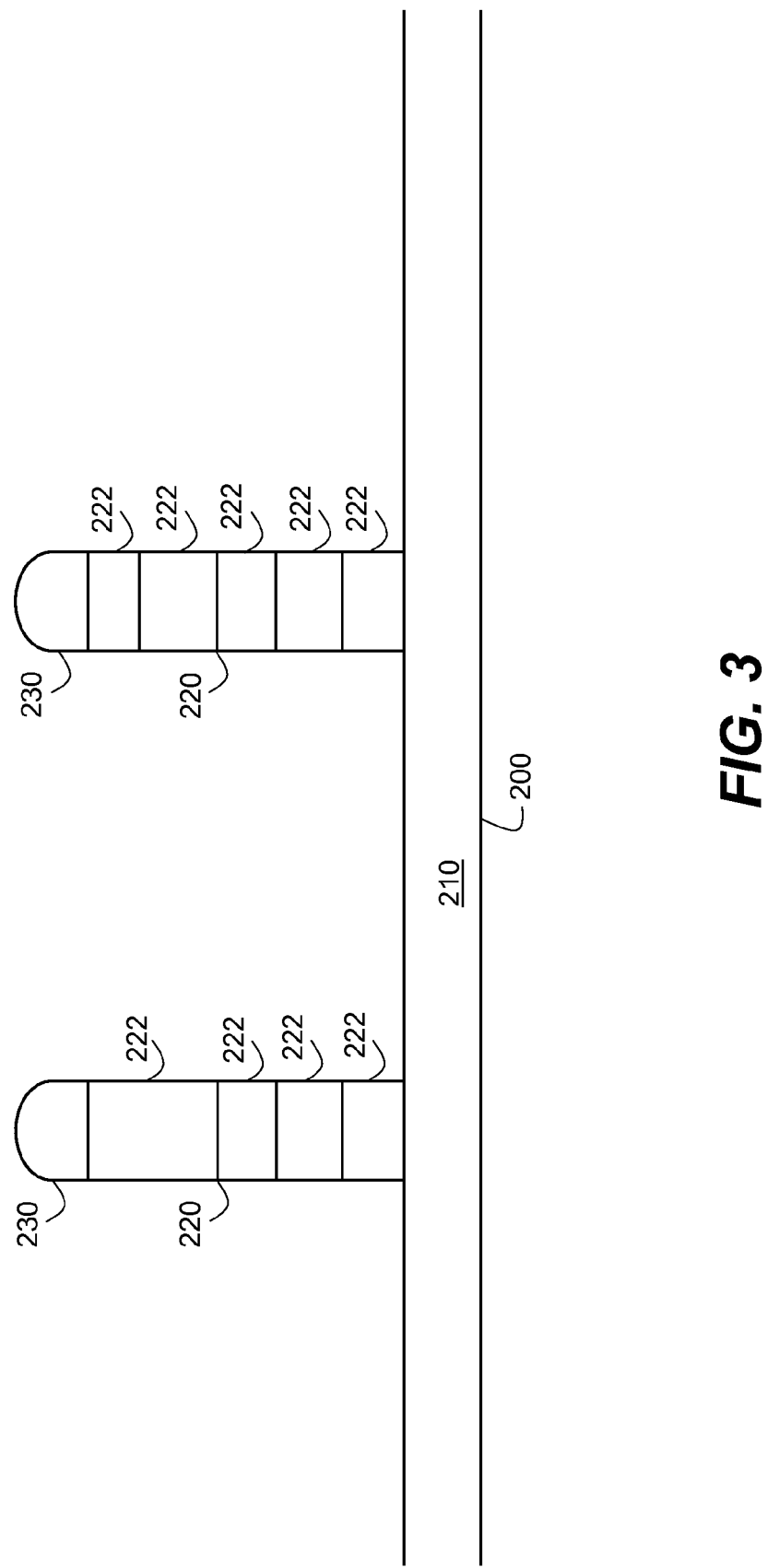
FIG. 3 shows a schematic of a II-VI semiconductor nanowire which includes discrete heterostructure units.

The II-VI semiconductor nanowires 220 of the present invention can be simple binary compounds, such as, ZnSe or CdTe, more complex ternary compounds, such as, ZnSeS or CdZnSe, or even quaternary compounds, such as, ZnMgSSe or ZnMgSeTe. In some cases, the material composition of the II-VI semiconductor nanowire 220 will be uniform along its length, in others, the material composition can be varied discretely along its length, using MOVPE growth techniques that are well known in the art. Referring to FIG. 3 is illustrated a II-VI semiconductor nanowire 220 which contains discrete heterostructure units 222. In some cases the discrete heterostructure units 222 will be uniform in composition, in others, the material composition will smoothly vary from one composition to another, such as, from $ZnSe_{0.5}S_{0.5}$ to ZnS. Each of the discrete heterostructure units 222 can be composed of the same composition (in which case the II-VI semiconductor nanowire 220 will have a uniform composition) or they can vary, as is well known in the art, in order to produce nanowires with specific properties. The discrete heterostructure units 222 can vary in number from 1 (in which case the II-VI semiconductor nanowire 220 will have a uniform composition) to hundreds, as is well known in the art. The lengths of the discrete heterostructure units 222 can vary from many microns down to quantum well dimensions of 1 to 10 nm. In general the discrete heterostructure units 222 can vary in both length and in composition along the extent of the II-VI semiconductor nanowires 220 in order to produce II-VI semiconductor nanowires 220 with desired physical attributes. The overall lengths of the II-VI semiconductor nanowires 220 can range from 500 nm to tens of microns, with the preferred length range being 2 to 10 microns. With regard to the thickness of the II-VI semiconductor nanowires 220 they are typically less than 500 nm, with a preferred thickness being less than 100 nm. With regard to II-VI semiconductor nanowires 220 with very small thicknesses, 10 nm thick nanowires can be made routinely by methods well known in the art. Sub 10 nm thick nanowires are more difficult to produce since they require equally small metal alloy nanoparticles 230.

Figure 4:
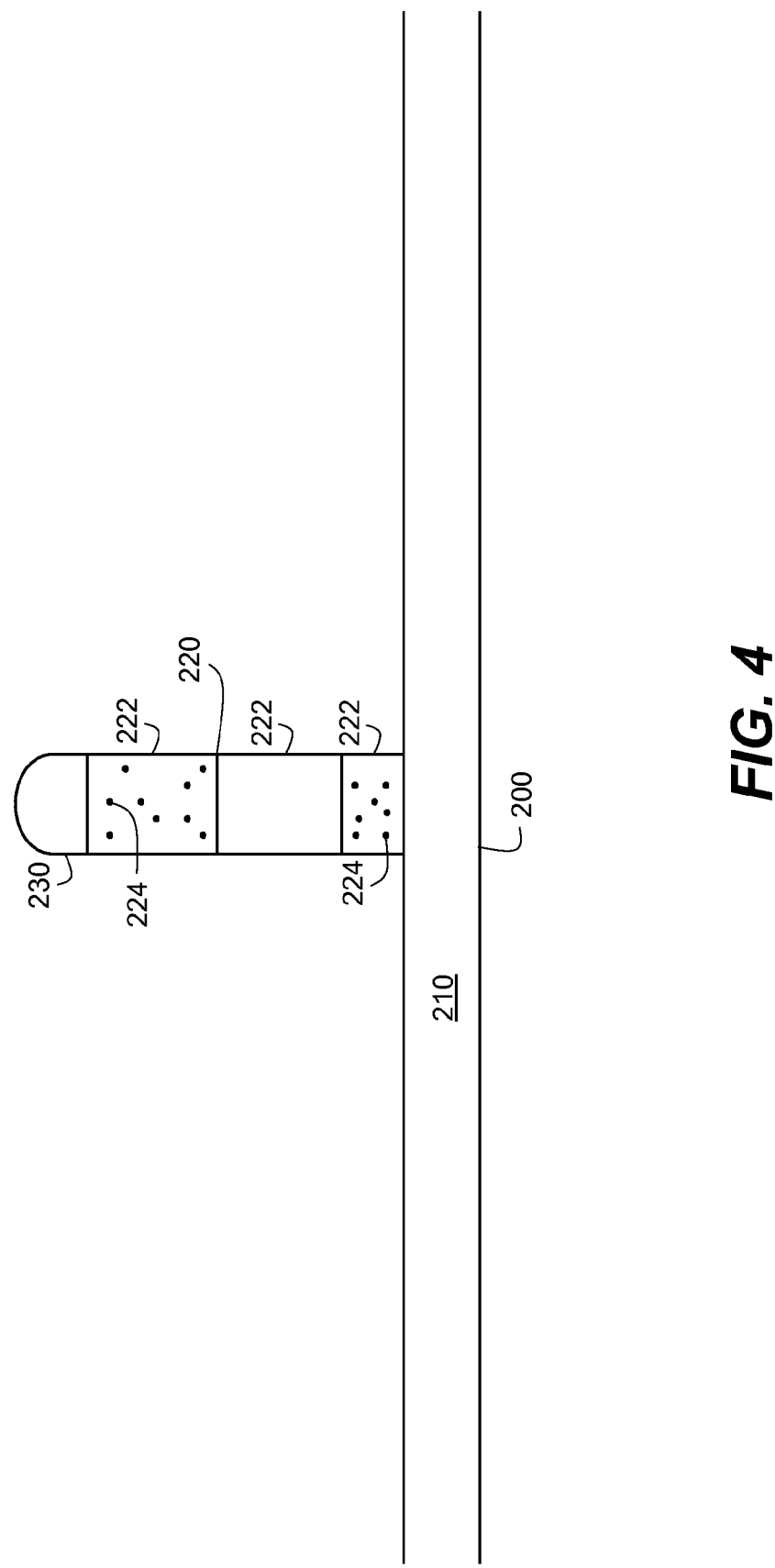
FIG. 4 shows a schematic of a II-VI semiconductor nanowire which includes doped discrete heterostructure units.

FIG. 4 illustrates II-VI semiconductor nanowires 220 where some of the discrete heterostructure units 222 contain dopants 224 in order to modify the conductivity of the nanowires. As is well known in the art, the dopants 224 can be either n-type or p-type. For II-VI materials, some of the demonstrated n-type dopants 224 are Al, In, Ga, Cl, Br, and I. The highest doping levels are typically obtained with the column VII elements substituting for the chalcogens, for example, Cl substituting for Se in ZnSe. An effective n-type dopant for MOVPE applications is Cl since precursors, such as, butyl chloride, are easy to use, readily available, and doping levels in the $10^{18}$ cm$^{-3}$ range be obtained. With regard to p-type dopants, column I or column V elements have been successfully implemented for II-VI materials. Representative column I elements are Li and Cu, while representative column V elements are N, P, and As. In addition to these elements, LiN has been demonstrated to be an effective p-type dopant for II-VI materials. As illustrated in FIG. 4, the dopant level and types can differ between the various discrete heterostructure units 222. More specifically, each discrete heterostructure unit 222 can have a different dopant 224 species, type (n- or p-), and concentration, with some discrete heterostructure units 222 being nominally undoped (or intrinsic regions). Overall the distribution of dopants is selected, as is well known in the art, in order to obtain specific properties for the II-VI semiconductor nanowires 220.

With regard to forming the II-VI semiconductor nanowires 220, the following processes can be used to make nanowires in accordance with the present invention. Variations from the following procedures can be practiced in accordance with this invention if they are well known to those practiced in the art. To begin a support 200 need to be chosen. As discussed above the support can be any material structure which can withstand the MOVPE growth temperatures (up to ~400° C. for the shelling materials). Correspondingly, glass, semiconductor substrates, such as Si or GaAs, metal foils, and high temperature plastics can be used as supports 200. For particular supports 200, such as, Si or GaAs, it can be desirable to enhance the selectivity of the nanowire growth by forming a low energy surface film 210 on the surface of the support 200. The low energy surface film 210 can be deposited by processes, such as, sputtering, CVD, ALD, or electron-beam evaporation. Typical low energy surface films 210 are silicon oxide and aluminum oxide. In cases where the support 200 is silicon and the low energy surface film 210 is silicon oxide, the silicon oxide can also be formed by wet or dry thermal oxide processes. Appropriate cleaning procedures are followed prior to depositing the low energy surface films 210. Next metal alloy nanoparticles 230 need to be formed on the surface of the support 200 or low energy surface film 210. The metal alloy nanoparticles 230 can be formed by two different methods. In one instance dispersions of metal alloy nanoparticles 230 can formed, followed by deposition of the dispersion on the surface of the support 200 or low energy surface film 210. For this case, the metal alloy nanoparticles 230 can be synthesized by wet chemistry processes, as are well known in the art. Given the difficulty in forming colloidal metal nanoparticles containing more than one metallic element, it is preferred to deposit thin metal films containing the metals of interest, since very thin metal layers (<5 nm) typically deposit in discrete nano-islands instead of continuous films. Conventional deposition processes can be used, such as, thermal evaporation, sputtering, and e-beam evaporation to form the metallic films. The two or more metals composing the metal alloy nanoparticles 230 can be deposited either consecutively or simultaneously. In addition, sometimes it is beneficial to heat the support in order to aid in the formation of metal alloy nanoparticles 230 having particular sizes. The preferred metal alloy nanoparticles 230 are gold-tin alloys, where the preferred volume ratio of gold to tin ranges from 1:5 to 5:1. Other metal alloys can be used instead of Au—Sn as long as they meet the four criteria discussed above. As is well known in the art, standard cleaning procedures are to be followed prior to forming the metal alloy nanoparticles 230 on the surface of the support 200 or low energy surface film 210.

Next the support 200 containing the optional low energy surface film 210 and the metal alloy nanoparticles 230 are placed in a II-VI growth chamber in order to grow the II-VI semiconductor nanowires 220 by the VLS process. The growth can occur either by MBE or MOVPE, with MOVPE being the preferred process due to the lower manufacturing costs associated with MOVPE growth processes. As is well known in the art, sometimes it is desirable to pre-condition the growth surface prior to growing the nanowires. For example, hydrogen can be flowed at 0.5-2 liters/minute for 10 to 20 minutes, with the support 200 at a temperature of 300 to 500° C. As stated above, the preferred growth temperature for II-VI materials is between 260 and 330° C. As such, prior to growth of the nanowires, the support is heated to between 260 and 350° C. As is well known in the art, MOVPE growth can take place at sub-atmospheric pressures. Accordingly, it is preferred that the II-VI semiconductor nanowires 220 be grown at MOVPE reactor pressures ranging from 50 torr to 760 torr. Appropriate combinations of II-VI semiconductor precursors are selectively flowed (in addition to the main carrier gas) in order to form the discrete heterostructure units 222 composing the II-VI semiconductor nanowires 220. As is well known in the VLS art, the metal alloy nanoparticles 230 act as catalysts during the nanowire growth and as a result selectively provide localized growth of the II-VI semiconductor nanowires 220 at the positions of the metal alloy nanoparticles 230. With regard to the low energy surface film 210, its purpose is to enhance the selectivity of the nanowire growth. More particularly, the ideal nanowire growth occurs when semiconductor growth only occurs at the positions of the metal alloy nanoparticles 230. As is well known in the art, semiconductor precursors want to grow on high energy surfaces in order to reduce the total energy of the system. As such, when the precursors impinge on the low energy surface film 210, it is energetically favorable for them to diffuse to the positions of the metal alloy catalysts where they collect inside of the catalysts at high concentrations. Once the concentration of precursors is beyond the solubility limit of the metal alloy catalysts, they start forming the semiconductor nanowires from the bottom side of the catalysts (and thus initially on the growth surface). The II-VI semiconductor nanowire 220 increases in length as a result of additional growth just below the metal alloy catalyst, which remains on top of the II-VI semiconductor nanowires 220 as shown in FIGS. 2-4.

Typical II-VI semiconductor precursors include diethylzinc, dimethyl cadmium, bis(methyl-$\eta^5$-cyclopentadienyl) magnesium, tert-butyl selenide, tert-butyl sulfide, and di-isopropyl telluride, which are used to form the elements of Zn, Cd, Mg, Se, S, and Te. As is well known in the art, many II-VI semiconductor precursors have been tried over the years. The previous list includes those precursors which have been found to be reactive at the growth temperatures between 270 and 350° C. For many II-VI compounds the preferred molar ratio of semiconductor precursors impinging on the growth surface ranges from 1:1 to 1:4 of column II precursors to column VI precursors, respectively. For the cases where ternary or quaternary II-VI semiconductor nanowires are grown, at least two column II precursors or two column VI precursors need to be flowed during the growth sequence.

As discussed above, the II-VI semiconductor nanowires 220 are composed of discrete heterostructure units 222 that vary in composition, thickness, and doping (type and concentration). Standard MOVPE growth procedures are followed to grow each discrete heterostructure unit 222, whereby the semiconductor and dopant precursors are selectively chosen and switched in order to get the proper composition, thickness, and doping. With regard to the dopant precursors, again it is desirable that they be chosen such that they are reactive at the growth temperatures between 270 and 350° C. For example, appropriate Cl, N, and P precursors are butyl chloride, tert-butyl amine, and tri-n-butylphosphine; however, as is well known in the art, other precursors can be chosen. With regard to the composition of the discrete heterostructure units 222 they can be either uniform or compositionally graded from one end to the other. In addition, they can be composed of binary, ternary, or quaternary II-VI semiconductor compounds. Some representative binary compounds are ZnSe, CdTe, and ZnS; some representative ternary compounds are ZnSeTe, CdZnSe, and ZnSeS; and some representative quaternary compounds are ZnMgSeS and CdZnSeTe. Finally, each discrete heterostructure unit 222 can have different dopant 224 species, types (n- or p-), or concentrations.

The following examples are presented as further understandings of the present invention and are not to be construed as limitations thereon.

EXAMPLE 1

In this example ZnSe nanowires are formed on Si substrates, where a low energy surface film 210 of silicon oxide is on the surface of the Si. To begin the process the Si substrates are degreased in a sonicator using consecutively acetone, methanol, and water. Next the Si substrates are placed in a conventional dry thermal oxide furnace where 1 micron of oxide is formed on the surface. To form metal alloy nanoparticles 230 of gold-tin the substrates are placed in a conventional thermal evaporator whose base pressure goes down to ~$10^{-6}$ torr. Prior to thermal evaporation the substrates are degreased in a sonicator using consecutively acetone, methanol, and water. To form the gold-tin nanoparticles, 1 nm of gold was thermally evaporated, followed by 3 nm of tin. This Au:Sn thickness ratio of 1:3 corresponds to a tin molar concentration of 65%.

Growth of the ZnSe nanowires occurs in a home-built atmospheric pressure horizontal MOVPE apparatus. Prior to loading the nanoparticle-covered Si samples into the water-cooled (4° C.) glass reactor chamber, the samples are degreased consecutively in acetone, methanol, and water (no sonication). The Zn and Se precursors are diethylzinc and tert-butyl selenide, respectively. The carrier gas is He—H$_2$ (8% hydrogen), which flows at a rate of 1700 sccm. The ratio of Zn to Se precursors impinging on the samples is set to a ratio of 1:3.6. The samples are heated to 320° C. during the nanowire growth, which occurs for 60 minutes. The resultant ZnSe nanowires have average lengths on the order of 4-5 μm.

Figure 5:
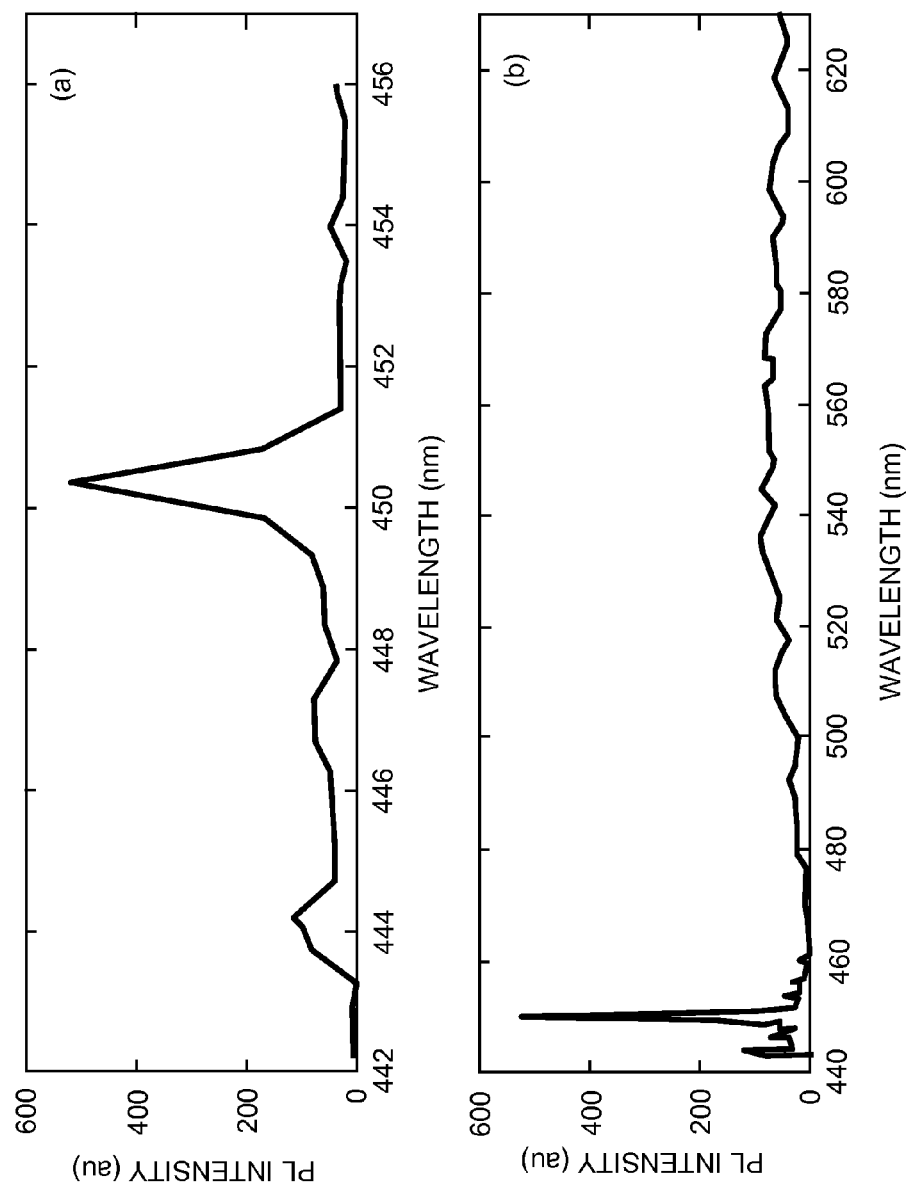
FIG. 5 shows the photoluminescence intensity of an array ZnSe core nanowires.
Figure 6:
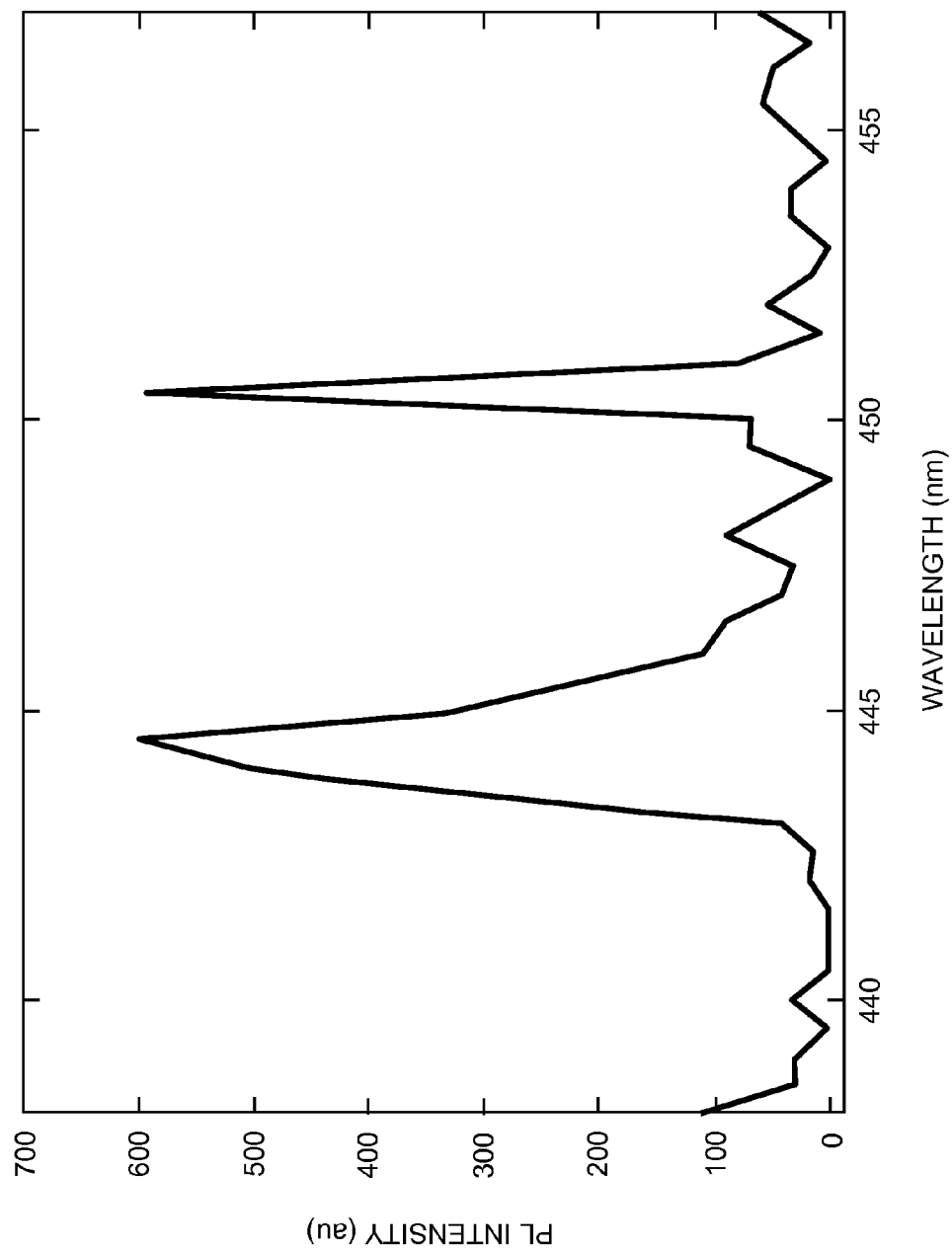
FIG. 6 shows the photoluminescence intensity of another array of ZnSe core nanowires.

Low temperature (77° K) photoluminescence results are given in FIGS. 5 and 6. The pump beam is the 10 mW continuous output from a Nichia 405 nm laser diode which is focused to a spot size of ~0.5 mm. The emission is detected by a Jobin-Yvon double monochrometer. The nanowires of FIG. 5 were grown by flowing 2.5 and 13.8 sccm of He—H$_2$ through the Zn and Se bubblers, respectively; while for FIG. 6 the nanowires were grown by flowing 1.8 and 9.9 sccm of He—H$_2$ through the Zn and Se bubblers, respectively. FIGS. 5a and 6 show details of the near bandgap exciton region, while FIG. 5b shows the entire spectra. Both FIGS. 5a and 6 show exciton features at ~444.3 and 450.5 nm. The latter feature corresponds to bulk ZnSe exciton emission due to the ZnSe nanowires emitting in the direction parallel to the long dimension of the nanowires. The shorter wavelength nanowire emission at 444.3 nm is due to the nanowires emitting in the perpendicular direction, and thus, quantum confined by the sides of the nanowires. Since the ZnSe nanowire diameters are on the order of 25-40 nm, the degree of quantum confinement is small. The sub-bandgap defect emission present (beyond 480 nm) in the spectra of FIG. 5b is due to traps at the surfaces of the nanowires since the ZnSe nanowires are not shelled or covered with passivating organic ligands. Experiments in which the ZnSe nanowires are shelled with ZnSeS resulted in the elimination of these defects. Both figures show that the peak exciton to peak defect emission ratio is 10:1, which is very good for unshelled ZnSe nanowires grown under stoichiometric conditions. It should also be noted that there is an absence of the Y-line defect at around 485 nm which is typically present in bulk ZnSe with internal defects. Overall the two figures indicate that highly crystalline ZnSe nanowires are formed with very minimal amounts of internal defects.

EXAMPLE 2

Figure 7:
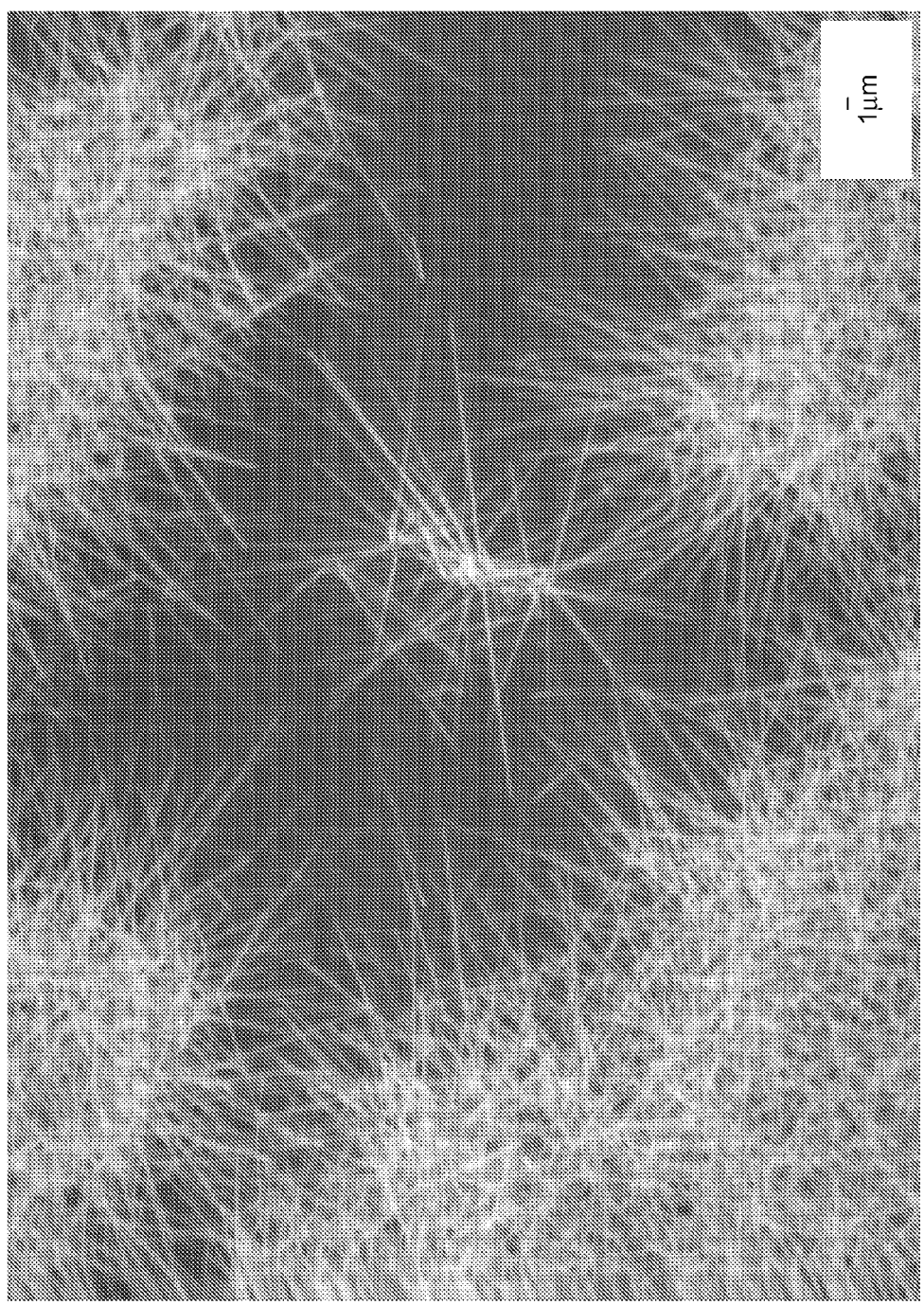
FIG. 7 shows a representation of a scanning electron microscope image of ZnTe core nanowires.
Figure 8:
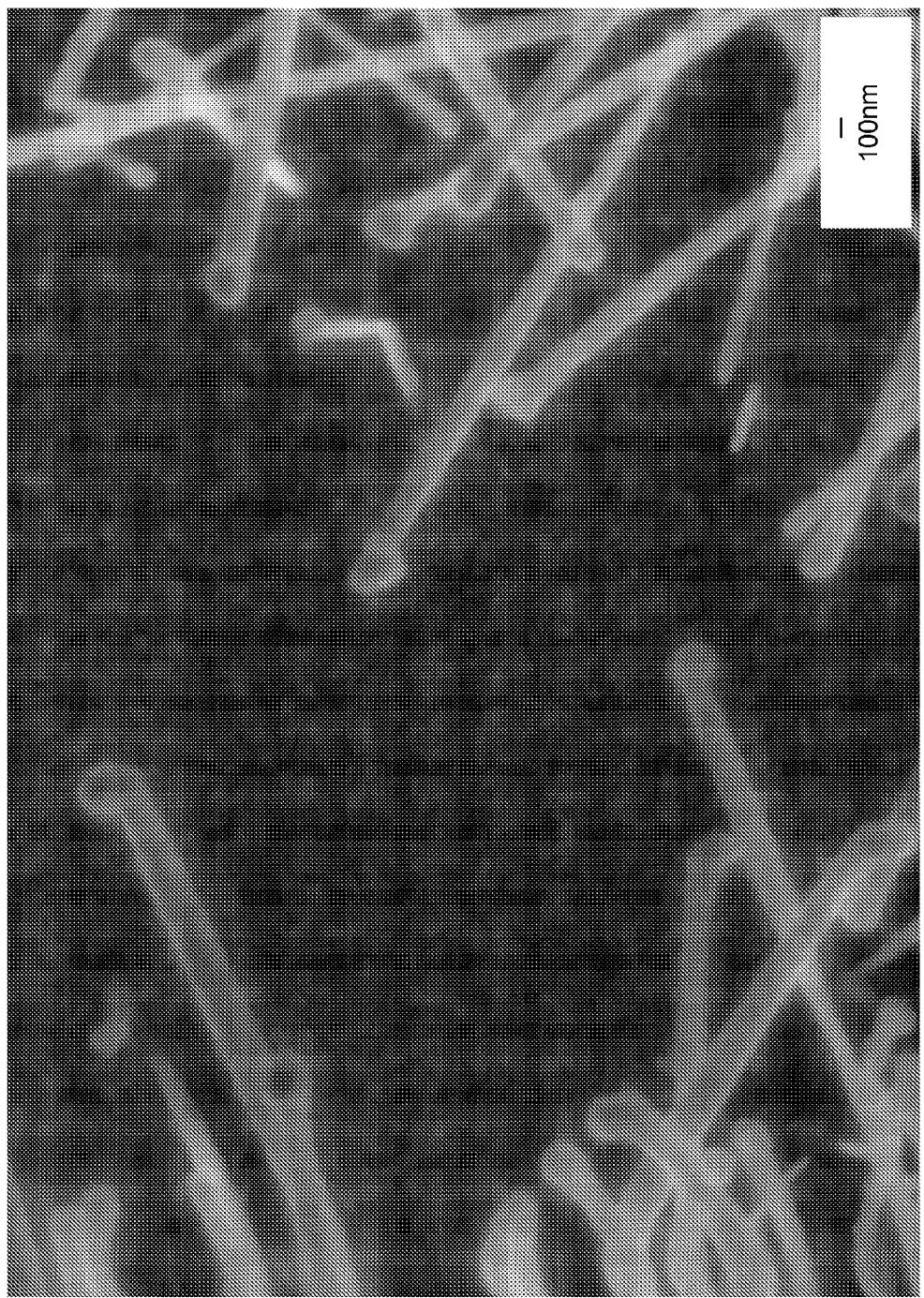
FIG. 8 shows a representation of a scanning electron microscope image of another set of ZnTe core nanowires.

In this example ZnTe nanowires are grown. The growth conditions are analogous to that described in Example 1 except for the following. With regard to growing the thin films of gold and tin, 1 nm of Au is evaporated, followed by 2 nm of Sn. This Au:Sn thickness ratio of 1:2 corresponds to a tin molar concentration of 56%. The Te precursor is di-isopropyl telluride. During the ZnTe nanowire growth, 2.5 and 23.6 sccm of He—H$_2$ flows through the Zn and Te bubblers, respectively (for a mole ratio of 1:3). The cores grew at 320° C. for 66 minutes. FIGS. 7 and 8 give scanning electron microscope (SEM) images of the ZnTe nanowires at two different magnifications. FIG. 7 shows that long (multi-micron) and uniform ZnTe nanowires are formed with a minimal amount of uncatalyzed (bulk) ZnTe growth. FIG. 8 shows the ends of the ZnTe nanowires where the Au—Sn nanoparticles are still present on the ends. Due to the size of the nanoparticles, the nanowire diameters are on the order of 100 nm. Overall the two figures indicate that highly selective and uniform growth of ZnTe nanowires occurs as a result of employing metallic alloy nanoparticles (catalysts) composed of gold and tin.

EXAMPLE 3

Figure 9:
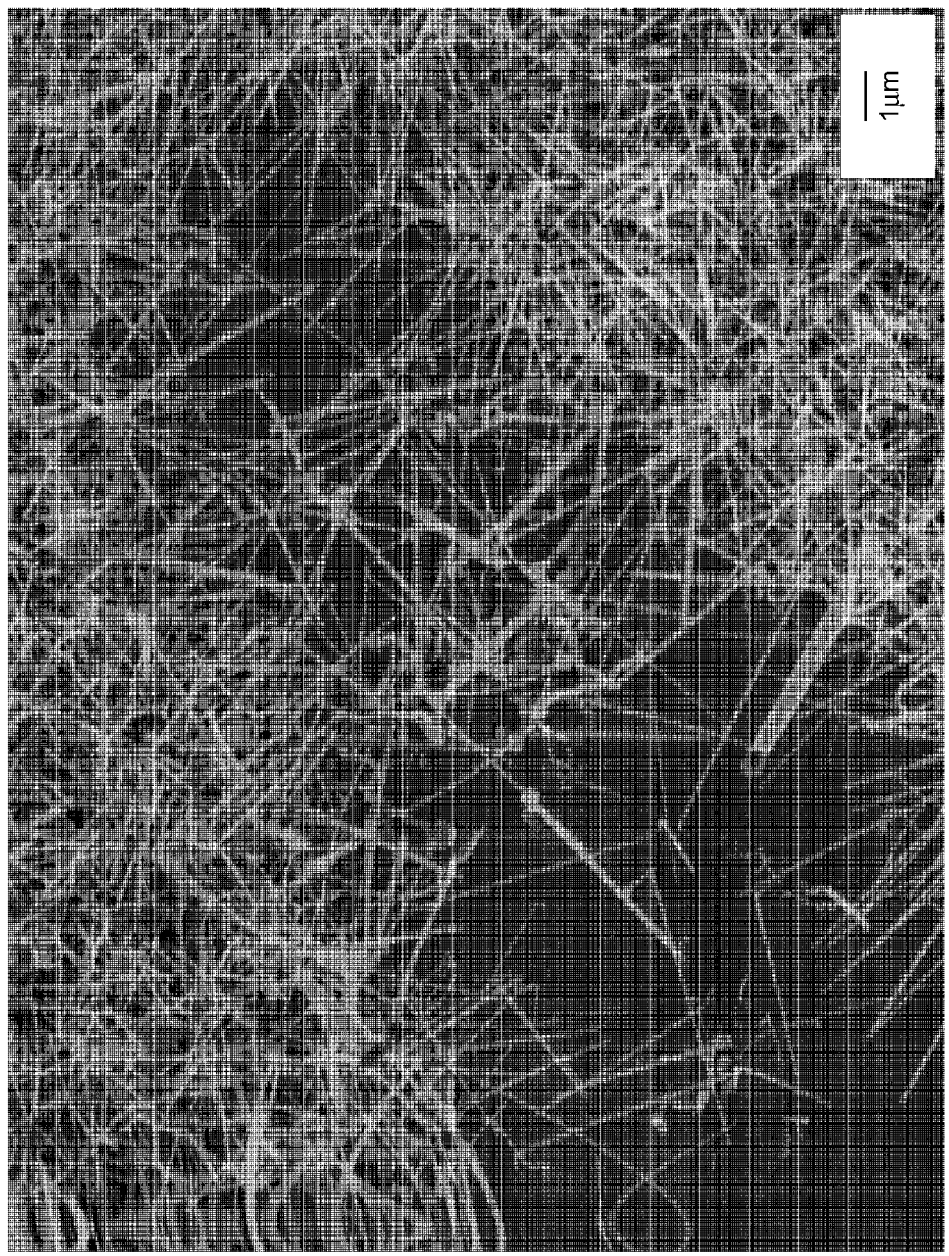
FIG. 9 shows a representation of a scanning electron microscope image of ternary ZnSeTe core nanowires.

In this example, the composition of the nanowire (ZnSeTe) is changed along its length. The conditions are analogous with that reported above for the ZnTe nanowires except for the following. Namely, ternary ZnSeTe (25% Te as set by the molar flow ratios) is grown for 30 minutes at 320° C., followed by 30 minutes of ZnSeTe (75% Te) at 320° C. The Zn, Se, and Te precursors employed in the growth are those used in Examples 1 and 2. During the growth of the ZnSeTe (25% Te), 2.5, 10.3, and 5.9 sccm of He—H$_2$ flows through the Zn, Se, and Te bubblers, respectively; while during the growth of the ZnSeTe (75% Te), 2.5, 3.4, and 17.7 sccm of He—H$_2$ flows through the Zn, Se, and Te bubblers, respectively. FIG. 9 shows a representation of an SEM image of the mixed ternary ZnSeTe nanowires. The figure indicates that, as for the ZnTe nanowires, highly selective growth of the ZnSeTe nanowires occurs, with minimal unwanted bulk ZnSeTe deposition in the spaces between the metal alloy nanoparticles. The figure also shows that, for the most part, the ZnSeTe nanowires are fairly uniform in both thickness and length. Overall the figure indicates that as a result of employing metallic alloy catalysts composed of gold and tin, that high quality ternary nanowires can be grown at low temperatures. More importantly, the ternary composition can be varied greatly along its length without any adverse impact on the quality of the nanowires.

In summary, all three examples show that high quality II-VI semiconductor nanowires can be grown at low temperatures using atmospheric pressure MOVPE using metal-alloy nanoparticles as the catalysts.

The invention has been described in detail with particular reference to certain preferred embodiments thereof, but it will be understood that variations and modifications can be effected within the spirit and scope of the invention.

PARTS LIST

100 substrate
110 semiconductor nanowire
120 metal nanoparticle
200 support
210 low energy surface film
220 II-VI semiconductor nanowire
222 discrete heterostructure unit
224 dopants
230 metal alloy nanoparticle

The invention claimed is:

1. A plurality of semiconductor nanowires each being fixed to the same support, each of the nanowires comprising II-VI materials and each nanowire terminating in a free end and a metal alloy nanoparticle is fixed to each nanowire at its free end, wherein the metal alloy nanoparticle is a nanowire growth catalyst having a melting point of 330° C. or less and above the metal alloy's eutectic temperature.

2. The plurality of semiconductor nanowires of claim 1 wherein the support includes glass, semiconductor substrates, metal foils, or high temperature plastics.

3. The plurality of semiconductor nanowires of claim 1 wherein the support includes a low energy surface film.

4. The plurality of semiconductor nanowires of claim 3 wherein the low energy surface film includes silicon oxide or aluminum oxide.

5. The plurality of semiconductor nanowires of claim 1 wherein the metal alloy nanoparticle is gold-tin (Au—Sn).

6. The plurality of semiconductor nanowires of claim 5 wherein the molar percentage of tin in the gold-tin alloy is at least 56%.

7. The plurality of semiconductor nanowires of claim 1 wherein the II-VI materials includes binary, ternary, or quaternary II-VI compositions.

8. The plurality of semiconductor nanowires of claim 1 wherein the diameter of each nanowire is less than 500 nanometers.

9. The plurality of semiconductor nanowires of claim 8 wherein the diameter of each nanowire is less than 100 nanometers.

10. The plurality of semiconductor nanowires of claim 1 wherein the length of each nanowire is greater than 500 nanometers.

11. The plurality of semiconductor nanowires of claim 10 wherein the length of each nanowire is greater than 2 microns.

12. The plurality of semiconductor nanowires of claim 1 wherein each nanowire includes one or more discrete heterostructure units whose II-VI material composition is either uniform or varies over its length.

13. The plurality of semiconductor nanowires of claim 12 wherein the discrete heterostructure units have lengths which range from 1-10 nm to microns.

14. The plurality of semiconductor nanowires of claim 1 further including dopants in the nanowires which modifies the conductivity of the nanowires.

15. The plurality of semiconductor nanowires of claim 14 wherein the dopants are n-type and are selected from Al, In, Ga, Cl, Br or I.

16. The plurality of semiconductor nanowires of claim 14 wherein the dopants are p-type and are selected from N, P, As, Li, Cu, or LiN.

* * * * *